(12) United States Patent
Kratzer et al.

(10) Patent No.: US 9,192,082 B2
(45) Date of Patent: Nov. 17, 2015

(54) ELECTROMAGNETIC INTERFERENCE SHIELD

(71) Applicant: FISHER CONTROLS INTERNATIONAL LLC, Marshalltown, IA (US)

(72) Inventors: Scott R. Kratzer, Marshalltown, IA (US); Davin Scott Nicholas, Marshalltown, IA (US); Barry L. Gaarder, Marshalltown, IA (US)

(73) Assignee: FISHER CONTROLS INTERNATIONAL LLC, Marshalltown, IA (US)

( * ) Notice: Subject to any disclaimer, the term of this patent is extended or adjusted under 35 U.S.C. 154(b) by 0 days.

(21) Appl. No.: 14/259,686

(22) Filed: Apr. 23, 2014

(65) Prior Publication Data

US 2014/0231128 A1 Aug. 21, 2014

Related U.S. Application Data

(63) Continuation of application No. 13/220,138, filed on Aug. 29, 2011, now Pat. No. 8,792,246.

(51) Int. Cl.
*H05K 9/00* (2006.01)

(52) U.S. Cl.
CPC ............ *H05K 9/00* (2013.01); *H05K 9/0028* (2013.01); *Y10T 29/49124* (2015.01)

(58) Field of Classification Search
CPC ... H05K 9/00; H05K 9/0028; Y10T 29/49124
USPC ............ 361/752, 753, 759, 799, 816, 818; 174/354
See application file for complete search history.

(56) References Cited

U.S. PATENT DOCUMENTS

| | | |
|---|---|---|
| 5,014,160 A | 5/1991 | McCoy, Jr. |
| 5,353,201 A | 10/1994 | Maeda |
| 6,301,125 B1 | 10/2001 | Maeda |
| 6,687,135 B1 | 2/2004 | Kitade |
| 6,872,880 B2 | 3/2005 | King et al. |
| 8,149,594 B2 | 4/2012 | Nishihata |
| 2003/0128534 A1 | 7/2003 | Otani et al. |
| 2004/0256128 A1* | 12/2004 | King et al. .......... 174/35 R |
| 2007/0139904 A1 | 6/2007 | English et al. |
| 2008/0291654 A1 | 11/2008 | Liao et al. |
| 2010/0276948 A1 | 11/2010 | Shih et al. |

OTHER PUBLICATIONS

International Search Report for PCT/US2012/052003, mailed Nov. 26, 2012.
Written Opinion for PCT/US2012/052003, mailed Nov. 26, 2012.

* cited by examiner

*Primary Examiner* — Anatoly Vortman
*Assistant Examiner* — Jacob Crum
(74) *Attorney, Agent, or Firm* — Marshall, Gerstein & Borun LLP

(57) ABSTRACT

An assembly configured to protect a circuit board from electromagnetic interference. The assembly includes a metal shield and an enclosure. The metal shield includes a metal plate and a plurality of tangs. The plurality of tangs are spaced about and extend transversely away from at least a portion of a perimeter portion of the metal plate. The enclosure has a bottom wall and at least one sidewall disposed around a perimeter of the bottom wall, the at least one sidewall configured to urge the tangs of the metal shield inward when the metal shield is disposed in the enclosure.

13 Claims, 3 Drawing Sheets

ELECTROMAGNETIC INTERFERENCE SHIELD

CROSS-REFERENCE TO RELATED APPLICATIONS

The present application is a continuation of U.S. patent application Ser. No. 13/220,138, filed Aug. 29, 2011 and entitled "Electromagnetic Interference Shield," the disclosure of which is hereby expressly incorporated herein by reference.

FIELD OF THE DISCLOSURE

The present disclosure relates to electromagnetic interference shields for printed circuit boards.

BACKGROUND

Electronic circuitry assemblies, printed circuits boards (PCBs), and substrates containing circuitry and electronic components mounted thereon, often require electromagnetic interference (EMI) shields to limit the likelihood of signal interferences from electromagnetic waves, such as those caused by radio-frequency (RF) signals, high-power transmission lines, and other electronic and/or industrial components, for example.

EMI shields are often installed over or in proximity to sensitive electronic components on a circuit board to inhibit interference from propagating. An EMI shield may be varying in shape and size in relation to the sensitivity of the electronics and the material used in construction of the EMI shield. It is known that an EMI shield is typically comprised of a metal sheet, a casting, or other conductive material such as a mesh or paint which is formed into a shape in relation to both the components and the space available on the circuit board. An EMI shield is usually precisely placed on a circuit board at a prescribed location and is attempted to be grounded, usually with a circuit ground. The EMI shield is typically installed by securing the shield to the circuit board. Often, compression fittings, screws, and/or soldering are used to secure the shield in place within an electronics enclosure or other housing, for example.

SUMMARY

One aspect of the present disclosure provides an assembly configured to be coupled to a circuit board for protecting the circuit board from electromagnetic interference. The assembly includes a metal shield for providing an electromagnetic interference shield and an enclosure. The metal shield includes a metal plate and a plurality of tangs. The metal plate has a perimeter portion. The plurality of tangs are spaced about and extend transversely away from at least a portion of the perimeter portion of the metal plate. Each tang includes a bridge portion and a finger portion. The bridge portion has a first end attached to the perimeter portion and a second end spaced away from the perimeter portion and attached to the finger portion. The finger portion extends away from the second end of the bridge portion and is disposed at an obtuse angle relative to the bridge portion. The enclosure has a bottom wall and at least one sidewall disposed around a perimeter of the bottom wall. The at least one sidewall includes an inclined interior surface configured to urge the tangs of the metal shield inward when the metal shield is disposed in the enclosure.

Another aspect of the present disclosure provides an assembly configured to be coupled to a circuit board for protecting the circuit board from electromagnetic interference. The assembly includes a metal shield for providing an electromagnetic interference shield and an enclosure. The metal shield includes a metal plate and a plurality of tangs. The metal plate has a perimeter portion. The plurality of tangs are spaced about and extend transversely away from at least a portion of the perimeter portion of the metal plate. Each tang includes a bridge portion and a finger portion. The bridge portion has a first end attached to the perimeter portion and a second end spaced away from the perimeter portion and attached to the finger portion. The finger portion extends away from the second end of the bridge portion and is disposed at an obtuse angle relative to the bridge portion. The enclosure has a bottom wall, at least one sidewall disposed around a perimeter of the bottom wall, and a cavity defined between the bottom wall and the at least one sidewall. The cavity has a cross-sectional dimension that diverges away from the bottom wall. The at least one sidewall of the enclosure is configured to urge the tangs of the metal shield inward when the metal shield is disposed in the cavity.

DETAILED DESCRIPTION

The present disclosure is directed to an electromagnetic interference (EMI) shield and related assembly including a printed circuit board (PCB) and enclosure, which beneficially reduces manufacturing and assembly times and ensures accurate alignment of the component parts.

Figure 1:
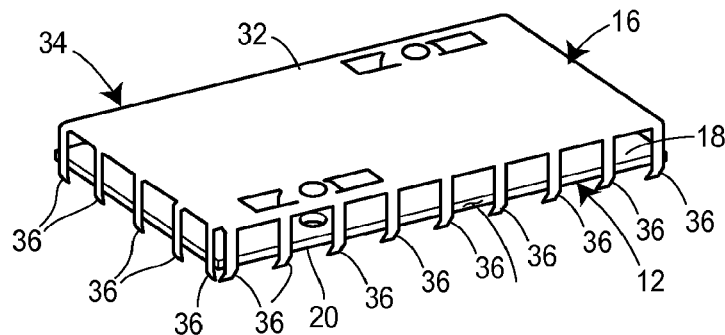
FIG. 1 is a perspective view of an electromagnetic interference (EMI) shield and printed circuit board (PCB) constructed and assembled in accordance with the principles of the present disclosure.
Figure 2:
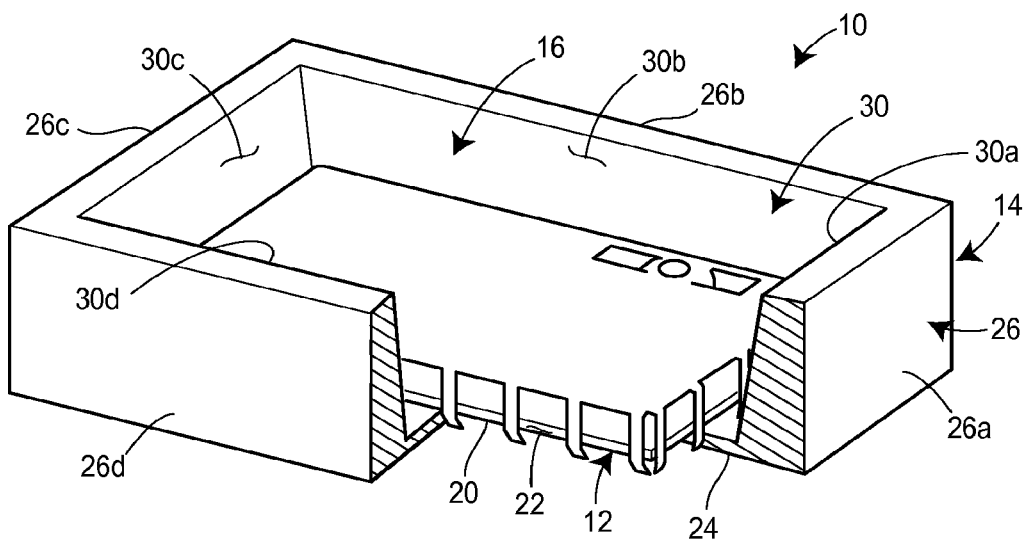
FIG. 2 is a partial cut-away perspective view of the EMI shield and PCB of FIG. 1 disposed within an enclosure and constructed and assembled in accordance with the principles of the present disclosure.

For example, FIG. 2 depicts an assembly 10 constructed and assembled in accordance with the principles of the present disclosure and includes a circuit board 12 such as a PCB, an enclosure 14, and an EMI shield 16. The enclosure 14 in FIG. 2 includes a partially cut-away portion to illustrate the positional relationship of the component parts, as will be described. FIG. 1 depicts the circuit board 12 and EMI shield 16 removed from the enclosure 14. In the disclosed version, the circuit board 12 comprises a generally rectangular circuit board 12 having a top surface 18, a bottom surface 20, and a perimeter edge 22, as is also identified in FIG. 3.

The enclosure 14 can be a generally conventional enclosure formed of plastic or metal casting, and includes a bottom wall 24 and at least one sidewall 26. In the disclosed version, because the circuit board 12 is generally rectangular, the bottom wall 24 of the enclosure 14 is also rectangular. As such, that at least one sidewall 26 of the disclosed version of the enclosure 14 includes first through fourth sidewalls 26*a*-

26d. So configured, the sidewalls 26a-26d are disposed around a perimeter of the bottom wall 24 to define a cavity 28 between the bottom wall 24 and the sidewalls 26a-26d of the enclosure 14. Each of the sidewalls 26a-26d includes a corresponding inclined interior wall surface 30a-30d. The interior wall surfaces 30a-30d of opposing sidewalls 26a-26d diverge away from the bottom wall 24. More specifically, the interior wall surfaces 30a, 30c of the first and third sidewalls 26a, 26c diverge away from each other as they extend away from the bottom wall 24. Similarly, the interior wall surfaces 30b, 30d of the second and fourth sidewalls 26b, 26d diverge away from each other as they extend away from the bottom wall 24.

While the circuit board 12 and correspondingly, the enclosure 14, of the version of the assembly depicted in the figures are generally rectangular in shape, the disclosure is equally applicable and intended to include circuit boards having generally any shape. The circuit board 12 could be circular, square, triangular, hexagonal etc. In any of these cases, the shape and configuration of the enclosure 14 and the EMI shield 16, which is to be discussed in more detail below, would be correspondingly adjusted to accommodate the differently shaped circuit board 12.

Referring again to FIGS. 1 and 2, the EMI shield 16 is attached to the circuit board 12 for protecting the circuit board 12 from electromagnetic interference. The EMI shield 16 includes a metal plate 32 having a perimeter portion 34 and a plurality of tangs 36 extending away from the perimeter portion 34. In a preferred version of the EMI shield 16, the metal plate 32 and the tangs 36 are constructed from a single piece of metal and manufactured through a stamping operation, for example.

Figure 3:
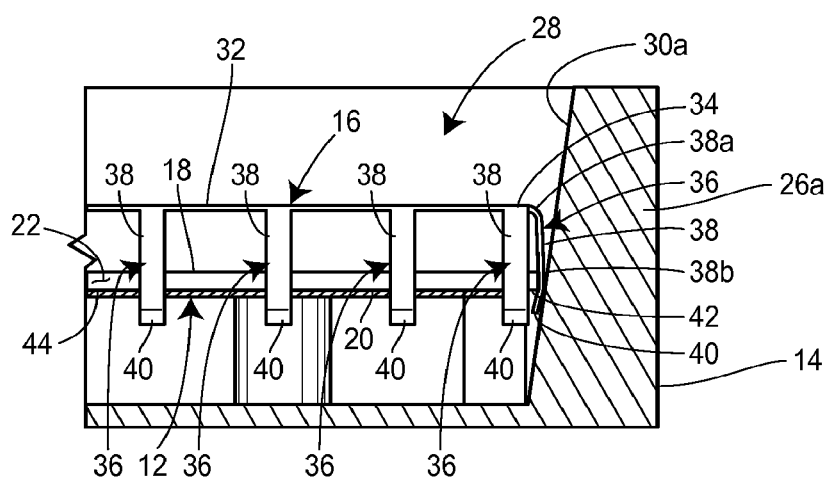
FIG. 3 is a detailed sectional view taken from circle 3 of FIG. 2.

In the disclosed version, the plurality of tangs 36 are spaced generally equally about the entirety of the perimeter portion 34 of the metal plate 32. Preferably, the spacing between adjacent tangs is equal to or less than approximately ½". Not all spacing must be equal to each other, however. In some versions, however, the plurality of tangs 36 could only be spaced about a portion of the perimeter portion 34, for example, along three of the four sides. Moreover, the plurality of tangs 26 extend transversely away from the metal plate 32. Referring to FIG. 3 and for the sake of description, each tang 36 of the currently disclosed version includes a bridge portion 38 and a finger portion 40, as identified in FIG. 3, wherein the bridge portion 38 is longer than the finger portion 40. The bridge portion 38 of each tang 36 includes a first end 38a attached to the perimeter portion 34 of the plate 32 and a second end 38b spaced away from the perimeter portion 34 and attached to the finger portion 40. The finger portion 40 extends away from the second end 38b of the bridge portion 38 and is disposed at an angle relative to the bridge portion 38. In the disclosed version, the angle is an obtuse angle, i.e., the angle is great than 90°. So configured, and as depicted in FIG. 3, each of the plurality of tangs 36 defines a recess 42 where the bridge portion 38 meets the finger portion 40. The recesses 42 of the plurality of tangs 36, in combination, receive the circuit board 12 to attach the EMI shield 16 to the circuit board 12.

Referring to FIGS. 2 and 3, the circuit board 12 and the EMI shield 16 are disposed in the cavity 28 of the enclosure 14 such that each of the tangs 36 of the EMI shield 16 are disposed between the perimeter edge 22 of the circuit board 12 and the at least one sidewall 26a-26d of the enclosure 14. More specifically, as shown in FIG. 3, each of the tangs 36 of the EMI shield 16 are disposed between the perimeter edge 22 of the circuit board 12 and an inclined interior surface 30a-30d of one of the sidewalls 26a-26d such that the inclined interior wall surfaces 30a-30d urge the tangs 36 toward the perimeter edge 22 of the circuit board 12. In the version depicted in FIGS. 2 and 3, this urging causes each of the tangs 36 to contact and become engaged with the perimeter edge 22 of the circuit board 12. In the version depicted in FIGS. 2 and 3, for example, this engagement between the tangs 36 and the perimeter edge 22 of the circuit board 12 creates a grounded electrical connection.

Figure 4:
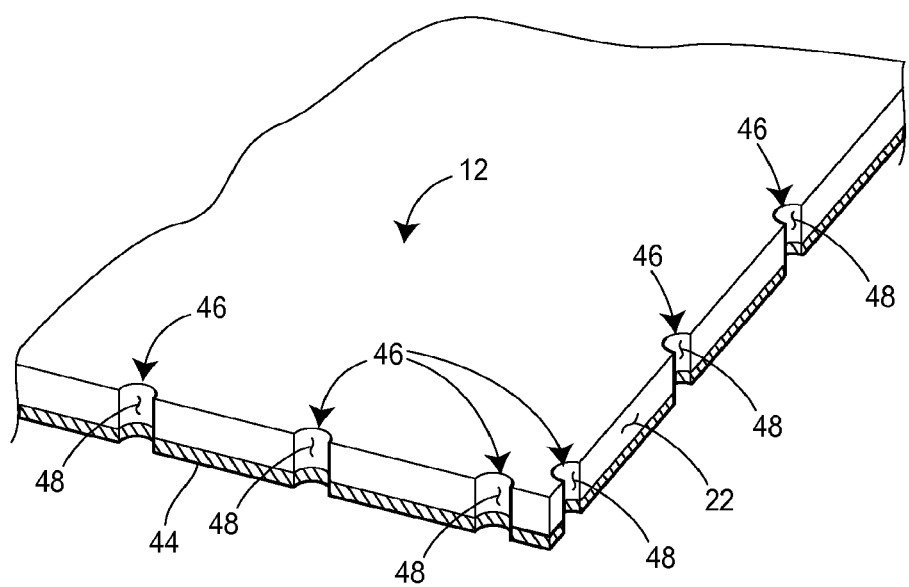
FIG. 4 is a detailed view of one version of a circuit board constructed in accordance with the principles of the present disclosure.

Specifically, as shown in FIG. 3, a metal ground plate 44 is mounted to the bottom surface 20 of the circuit board 12 such that the ground plate 44 is disposed between the circuit board 12 and the bottom wall 24 of the enclosure 14. In one form, the ground plate 44 can include a copper plate. While the ground plate 44 is described as being attached to the circuit board 12, it could also be integrated into the circuit board 12 itself using a layer of copper, for example, on the board 12. To further facilitate the electrical connection between the ground plate 44 and the tangs 36, the circuit board 12 includes a plurality of notches 46, as shown in FIG. 4. Each of the notches 46 includes a partially-cylindrical recess formed in the perimeter edge 22 of the circuit board 12. An internal surface 48 of each notch 46 is further plated with solder or some other electrically conductive material, for example, to provide an electrically conductive surface on the perimeter edge 22, which is connected directly to the ground plate 44.

Thus, when the EMI shield 16 depicted in FIGS. 1-3 is attached to the circuit board 12, each of the plurality of tangs 36 is disposed in one of the notches 46 on the perimeter edge 22 and in contact with the plated surface 48 such that the EMI shield 16 is electrically connected to the ground plate 44, thereby completing the electrical connection and enabling the complete system to protect any components that might be mounted on the top surface 18 of the circuit board 12 from the detrimental effects of electromagnetic interference.

While the EMI shield 16 depicted in FIGS. 1-3 is the same size as the corresponding circuit board 12 such that the tangs 36 all contact and engage the perimeter portion of the circuit board 12, other versions or variations of the circuit board 12 could be accommodated. For example, the circuit board 12 may be arranged such that only a portion, e.g., half, of the circuit board 12 requires an EMI shield 16. In such situations, the circuit board 12 could include a plurality of holes (not shown) arranged along a line, for example, through the center of the board 12 for receiving corresponding tangs 36 of an appropriately sized EMI shield 16. Similar to the notches 46 described with reference to FIG. 4, the holes could also be plated to facilitate an electrical connection with the ground plate 44.

Figure 5:
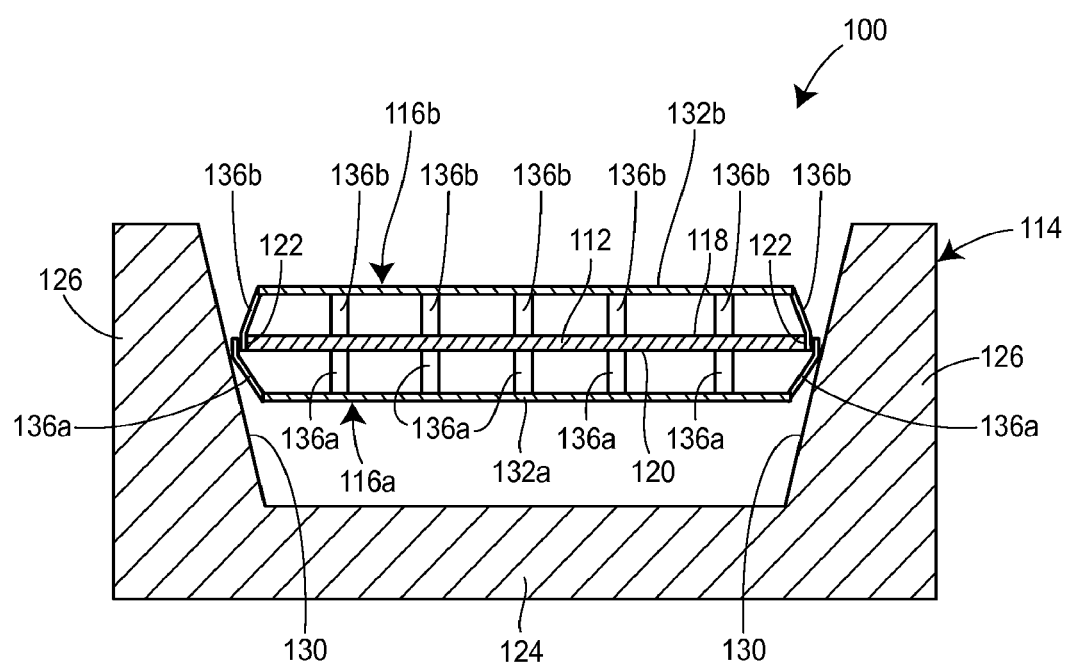
FIG. 5 is a cross-sectional side view of an EMI shield, PCB, and enclosure constructed in accordance with one alternative version of the present disclosure.

Further still, while the assembly 10 depicted in FIGS. 1-3 has been described as including a single EMI shield 16 mounted above the top surface 18 of the circuit board 12 for protecting electronic components mounted only to the top surface 18, for example, FIG. 5 depicts an embodiment of an assembly 100 constructed in accordance with the principles of the present disclosure that includes first and second EMI shields 116a, 116b, mounted adjacent to opposing top and bottom surfaces 118, 120 of a circuit board 112, thereby being capable of protecting sensitive electronic components mounted to both the top 118 and the bottom surfaces 120.

In FIG. 5, the first and second EMI shields 116a, 116b are substantially identical to the EMI shield 16 described above with reference to FIGS. 1-3 in that they each include a corresponding plate 132a, 132b and plurality of tangs 136a, 136b. Additionally, the enclosure 114 is substantially identical to the enclosure 14 described above with respect to FIGS. 2 and 3. As such, all of the additional details of the EMI shields 116a, 116b and the enclosure 114 will not necessarily be repeated.

The circuit board 112 of the assembly 100 depicted in FIG. 5 is generally similar to the circuit board 12 described above, except that it does not require the ground plate 44. Moreover, the notches 46 are optional for alignment purposes, but it would not be necessary that the internal surfaces 48 of the notches 46 be plated. The ground plate 44 would not be included because the bottom surface 120 of the circuit board 112 would include electronic components attached thereto similar to the top surface 118. Moreover, as will be described, the assembly 100 depicted in FIG. 5 does not rely on a ground plate 44 to complete the electrical ground connection.

Specifically, as shown in FIG. 5, when assembled, each of the plurality of tangs 136a of the first EMI shield 116a are disposed between a perimeter edge 122 of the circuit board 112 and a sidewall 126 of the enclosure 114 such that an inclined interior wall surface 130 of the sidewall 126 urges each of the tangs 136a of the first EMI shield 116a toward the perimeter edge 122 of the circuit board 112. Furthermore, each of the plurality of tangs 136b of the second EMI shield 116b is disposed between the perimeter edge 122 of the circuit board 12 and one of the tangs 136a of the first EMI shield 116a.

So configured, as the inclined interior wall surface 130 of the sidewalls 126 of the enclosure 114 urge the tangs 136a of the first EMI shield 116a toward the perimeter edge 122 of the circuit board 112, the tangs 136a of the first EMI shield 116a are urged into contact with the tangs 136b of the second EMI shield 116b and the tangs 136b of the second EMI shield 116b are urged into contact with the perimeter edge 122 of the circuit board 112. The contacting tangs 136a, 136b creates an electrical connection between the first and second EMI shields 116a, 116b. So configured, the first and second EMI shields 116a, 116b of the assembly 100 depicted in FIG. 5 provide protection above the top surface 118 and below the bottom surface 120 of the circuit board 112.

In FIG. 5, the tangs 136b of the second EMI shield 116b are depicted as being disposed between the tangs 136a of the first EMI shield 116a and the perimeter edge 122 of the circuit board 112, but in an alternative version, the tangs 136a, 136b of the first and second EMI shields 116a, 116b could be reversed.

Based on the foregoing description, it should be appreciated that the unique arrangement and configuration of the tangs 36, 136a, 136b extending from the EMI shield(s) 16, 116a, 116b enable for a simple assembly of the EMI shield(s) 16, 116a, 116b to the circuit board 12, 112, while the inclined interior wall surfaces 30, 130 of the disclosed enclosure 14, 114 helps to maintain the desired electrical contact.

Additionally, in embodiments wherein the circuit boards 12, 112 include the notches 46 formed in the perimeter edge 22, 122, the present disclosure further ensures that the EMI shields 16, 116a, 116b are properly and accurately aligned relative to the circuit boards 12, 112, which alignment can affect the performance of the EMI shields 16, 116a, 116b in some applications. In some versions, the EMI shield 16, 116a, 116b and the circuit board 12, 112 can finally be secured into the enclosure 14, 114 with ordinary means including fasteners, adhesive, potting, etc., if desired.

One method of manufacturing the assembly 10 depicted in FIGS. 2 and 3 includes forming the enclosure 14 such that the enclosure 14 includes the bottom wall 24 and the at least one sidewall 26 with inclined interior surface 30. The enclosure 14 can be formed by molding plastic or casting metal, for example. Additionally, the method includes providing the circuit board 12. Furthermore, the method includes stamping the EMI shield 16 to include the plate 32 with the first perimeter portion 34 and the plurality of tangs 36 extending from the perimeter portion 34. Furthermore, the method includes bending the plurality of tangs 36 of the EMI shield 16 transverse to the plate 32. To achieve the specific construct of the tangs 36 described above with reference to FIG. 3, for example, the method further includes bending a distal portion of each of the plurality of tangs 36 to include the bridge portion 38 attached to the perimeter portion 34 of the metal plate 32 and the finger portion 40 extending from the bridge portion 38 to define the recess 42.

The circuit board 12 is then positioned between the plurality of tangs 36 and into the recesses 42 of the tangs 36, and the circuit board 12 and EMI shield 16 can be positioned into the cavity 28 of the enclosure 14. More specifically, the circuit board 12 and EMI shield 16 are inserted into the cavity 28 such that the inclined interior surface 30 of the sidewalls 26 contact the tangs 26 and urges them toward the perimeter edge 22 of the circuit board 12. In the version disclosed in reference to FIGS. 2 and 3, the inclined interior surfaces 30 of the sidewalls 26 urge the tangs 36 into direct abutting contact with the perimeter edge 22 of the circuit board 12 and, as such, into electrical contact with the ground plate 44 mounted to the bottom surface 20 of the circuit board 12 via the plated internal surfaces 48 of the notches 46.

To manufacture the notches 46 in the perimeter edge of the circuit board 12, one method further includes drilling a plurality of holes through a circuit board blank. The circuit board blank is then cut along a line that extends through the plurality of holes to form the circuit board 12 having the perimeter edge 22, which is defined by the cut, having the plurality of notches 46. Additionally, for the version of the assembly disclosed with reference to FIGS. 2 and 3, the interior surface 48 of the notches 46 are plated with solder, for example. The surfaces 48 can be plated either before or after the circuit board blank is cut to form the circuit board 12.

With the circuit board 12 formed to include the notches 46, the EMI shield 16 is attached to the circuit board 12 by positioning the circuit board 12 between the tangs 36 such that each tang 36 is positioned in a corresponding notch 46. This facilitates easy assembly and ensures proper alignment of the EMI shield 16 relative to the circuit board 12.

The assembly 100 described with reference to FIG. 5 can be manufactured and assembled in generally the same manner as the assembly 10 described above, with the exception that that notches 46 are optional and the assembly 100 includes the first and second EMI shield 116a, 116b. Nonetheless, the first and second EMI shields 116a, 116b are each manufactured identical to the EMI shield 16 described above. That is, the EMI shields 116a, 116b are first stamped, and then the tangs 136a, 136b are bent, as desired.

With the first and second EMI shields 116a, 116b formed, as desired, the circuit board 112 is positioned between the tangs 136b of the second EMI shield 116b, as shown in FIG. 5. Then, the circuit board 12, with the second EMI shield 116b attached, is positioned between the tangs 136a of the first EMI shield 116a. These three components, i.e., the circuit board 112, the first EMI shield 116a, and the second EMI shield 116b, are then positioned into the enclosure 114, as depicted in FIG. 5. As these components are inserted into the enclosure 114, the inclined interior surfaces 130 of the sidewalls 126 contact the tangs 136a of the first EMI shield 116a and urges them into contact with a corresponding one of the tangs 136b on the second EMI shield 116b. Moreover, the urging created by the inclined interior surfaces 130 further urges the tangs 136b of the second EMI shield into engagement with the perimeter edge 122 of the circuit board 112. The contact between the tangs 136a of the first EMI shield 116a and the tangs 136b of the second EMI shield 116b form an electrical connection between the first and second EMI shields 116a, 116b that completes a ground circuit for protecting any components carried by the top and bottom surfaces of the circuit board 112.

While the tangs 36, 136a, 136b of the various EMI shields 16, 116a, 116b described herein are described as including a bridge portion 38 and finger portion 40 disposed at an obtuse angle relative to each other, thereby defining the recess 42, this is merely one example. Other versions of the EMI shields 16, 116a, 116b may include tangs that are not bent at all, except relative to the plates 32, 132, or may include tangs that occupy a different bent configuration.

In view of the foregoing, it should be appreciated that the present invention is not intended to be limited to the specific examples described herein and depicted in the attached figured, but rather, is intended to be defined by the spirit and scope of the following claims, which can be further exemplified by the following "aspects" of the invention.

Aspect 1. A device for providing an electromagnetic interference shield to be attached to a circuit board for protecting the circuit board from electromagnetic interference, the device comprising: a metal plate having a perimeter portion; and a plurality of tangs spaced about and extending transversely away from at least a portion of the perimeter portion of the metal plate, each tang including a bridge portion and a finger portion, the bridge portion having a first end attached to the perimeter portion and a second end spaced away from the perimeter portion and attached to the finger portion, the finger portion extending away from the second end of the bridge portion and being disposed at an obtuse angle relative to the bridge portion such that the plurality of tangs, in combination, are adapted to receive a circuit board.

Aspect 2. The device of aspect 1, wherein the bridge portion of each tang is longer than the finger portion of each tang.

Aspect 3. The device of any one of the preceding aspects, wherein the flat metal plate and the plurality of tangs are formed from a single piece of metal.

Aspect 4. The device of any one of the preceding aspects, wherein the plurality of tangs are spaced equal to or less than ½" apart about the perimeter portion of the metal plate.

Aspect 5. The device of any one of the preceding aspects, wherein each tang defines a recess where the bridge portion meets the finger portion for receiving an edge of a circuit board.

Aspect 6. An assembly, comprising: a circuit board having a perimeter edge; an enclosure having a bottom wall and at least one sidewall disposed around a perimeter of the bottom wall, the sidewall including an inclined interior wall surface such that the enclosure defines a cavity between the bottom wall and the at least one sidewall, the cavity having a cross-sectional dimension that diverges away from the bottom wall; and at least one metal shield attached to the circuit board for protecting the printed circuit board from electromagnetic interference, the shield comprising a metal plate having a perimeter portion and a plurality of tangs extending away from the perimeter portion, the circuit board and the shield disposed in the cavity of the enclosure such that each of the tangs of the shield are disposed between the perimeter edge of the circuit board and the at least one sidewall of the enclosure such that the inclined interior wall surface of the at least one sidewall urges the tangs toward the perimeter edge of the circuit board.

Aspect 7. The assembly of aspect 6, wherein the plurality of tangs are spaced equal to or less than ½" apart about and extend transversely away from the perimeter portion of the metal plate.

Aspect 8. The assembly of any one of aspects 6 to 7, wherein each tang includes a bridge portion and a finger portion, the bridge portion having a first end attached to the perimeter portion of the metal plate and a second end spaced away from the perimeter portion of the metal plate, the finger portion attached to and extending away from the second end of the bridge portion and being disposed at an obtuse angle relative to the bridge portion such that the plurality of tangs, in combination, receive the circuit board.

Aspect 9. The assembly of any one of aspects 6 to 8, wherein each tang defines a recess where the bridge portion meets the finger portion, the recess receiving a portion of the edge of the circuit board.

Aspect 10. The assembly of any one of aspects 6 to 9, wherein the bridge portion of each tang is longer than the finger portion of each tang.

Aspect 11. The assembly of any one of aspects 6 to 10, wherein the metal plate and the plurality of tangs of the at least one shield are formed from a single piece of metal.

Aspect 12. The assembly of any one of aspects 6 to 11, further comprising a metal ground plate mounted to a surface of the circuit board and disposed between the circuit board and the bottom wall of the enclosure, and wherein the metal plate of the shield is disposed opposite the circuit board from the metal ground plate such that each of the plurality of tangs are electrically connected to the copper plate.

Aspect 13. The assembly of any one of aspects 6 to 12, wherein the perimeter edge of the circuit board includes a plurality of plated notches corresponding to the plurality of tangs of the shield, each of the plurality of plated notches receiving one of the plurality of tangs.

Aspect 14. The assembly of any one of aspects 6 to 13, wherein the at least one metal shield comprises a first metal shield mounted to the circuit board and a second metal shield mounted to the circuit board opposite the circuit board from the first metal shield, the plurality of tangs of the first metal shield disposed between the perimeter edge of the circuit board and the at least one sidewall of the enclosure such that the inclined interior wall surface of the at least one sidewall urges each of the tangs into contact with the perimeter edge of the circuit board, and the plurality of tangs of the second metal shield disposed between the perimeter edge of the circuit board and the at least one sidewall of the enclosure such that the inclined interior wall surface of the at least one sidewall urges each of the tangs into contact with one of the tangs of the first metal shield, thereby creating an electrical connection between the first and second metal shields.

Aspect 15. A method of manufacturing an electrical assembly, the method comprising: forming an enclosure having a bottom wall and at least one sidewall with an inclined interior surface, the sidewall extending about and away from the bottom wall to define a cavity between the bottom wall and the at least one sidewall; providing a circuit board; stamping a first metal shield comprising a first plate with a first perimeter portion and a first plurality of tangs extending from the first perimeter portion; bending the first plurality of tangs of the first metal shield transverse to the first plate; positioning the circuit board between the first plurality of tangs of the first metal shield; positioning the circuit board and first metal shield into the cavity of the enclosure such that the inclined interior surface of the at least one sidewall contacts the first plurality of tangs and urges the first plurality of tangs toward a perimeter edge of the circuit board.

Aspect 16. The method of aspect 15, further comprising: drilling a plurality of holes through a circuit board blank; cutting the circuit board blank through the plurality of holes to form the circuit board as having a perimeter edge having a plurality of notches.

Aspect 17. The method of any one of aspects 15 to 16, wherein positioning the circuit board between the first plurality of tangs comprises positioning each of the first plurality of tangs into a corresponding notch.

Aspect 18. The method of any one of aspects 15 to 17, further comprising bending a distal portion of each of the first plurality of tangs to include a bridge portion attached to the perimeter portion of the first metal plate and a finger portion extending from the bridge portion at an obtuse angle relative to the bridge portion thereby defining a recess where the bridge portion meets the finger portion, the recess for receiving the perimeter edge of the circuit board.

Aspect 19. The method of any one of aspects 15 to 18, further comprising: stamping a second metal shield comprising a second plate with a second perimeter portion and a second plurality of tangs extending from the second perimeter portion; bending the second tangs of the second metal shield transverse to the second plate; positioning the circuit board between the second plurality of tangs of the second metal shield, prior to inserting the circuit board and the first metal shield into the cavity of the enclosure; and positioning the circuit board, the first metal shield, and the second metal shield into the cavity of the enclosure such that the inclined interior surface of the at least one sidewall contacts the first plurality of tangs and urges each of the first plurality of tangs into contact a corresponding one of the second plurality of tangs, thereby forming an electrical connection between the first and second metal shields.

Aspect 20. The method of any one of aspects 15 to 19, further comprising urging the second plurality of tangs into contact with a perimeter edge of the circuit board.

What is claimed:

1. An assembly configured to be coupled to a circuit board for protecting the circuit board from electromagnetic inference, the assembly comprising:
   a metal shield for providing an electromagnetic interference shield, the metal shield comprising:
      a metal plate having a perimeter portion; and
      a plurality of tangs spaced about and extending transversely away from at least a portion of the perimeter portion of the metal plate, each tang including a bridge portion and a finger portion, the bridge portion having a first end attached to the perimeter portion and a second end spaced away from the perimeter portion and attached to the finger portion, the finger portion extending away from the second end of the bridge portion and being disposed at an obtuse angle relative to the bridge portion; and
   an enclosure having a bottom wall and at least one sidewall disposed around a perimeter of the bottom wall, the at least one sidewall including an inclined interior surface urging the tangs of the metal shield inward when the metal shield is disposed in the enclosure,
   wherein the metal shield comprises a first metal shield and a second metal shield, the first metal shield having a first metal plate with a first perimeter portion and a first plurality of tangs extending away from the first perimeter portion, the second metal shield having a second metal plate with a second perimeter portion and a second plurality of tangs extending away from the second perimeter portion, wherein the inclined interior surface of the enclosure urges each of the first plurality of tangs and each of the second plurality of tangs inward when the metal shield is disposed in the enclosure, and
   wherein the inclined interior surface of the enclosure urges each of the second plurality of tangs inward into contact with each of the first plurality of tangs when the metal shield is disposed in the enclosure.

2. An assembly configured to be coupled to a circuit board for protecting the circuit board from electromagnetic interference, the assembly comprising:
   a metal shield for providing an electromagnetic interference shield, the metal shield comprising:
      a metal plate having a perimeter portion; and
      a plurality of tangs spaced about and extending transversely away from at least a portion of the perimeter portion of the metal plate, each tang including a bridge portion and a finger portion, the bridge portion having a first end attached to the perimeter portion and a second end spaced away from the perimeter portion and attached to the finger portion, the finger portion extending away from the second end of the bridge portion and being disposed at an obtuse angle relative to the bridge portion; and
   an enclosure having a bottom wall, at least one sidewall disposed around a perimeter of the bottom wall, and a cavity defined between the bottom wall and the at least one sidewall, the cavity having a cross-sectional dimension that diverges away from the bottom wall, the at least one sidewall of the enclosure urging the tangs of the metal shield inward when the metal shield is disposed in the cavity.

3. The assembly of claim 2, wherein the bridge portion of each tang is longer than the finger portion of each tang.

4. The assembly of claim 2, wherein the metal plate and the plurality of tangs are formed from a single piece of metal.

5. The assembly of claim 2, wherein the plurality of tangs are spaced equal to or less than ½" apart about and extend transversely away from the perimeter portion of the metal plate.

6. The assembly of claim 2, wherein the at least one sidewall includes an inclined interior surface, the inclined interior surface urges the tangs of the metal shield inward away from the inclined interior surface when the metal shield is disposed in the enclosure.

7. The assembly of claim 6, wherein the inclined interior surface urges the finger portion of each tang inward away from the inclined interior surface when the metal shield is disposed in the enclosure.

8. The assembly of claim 2, wherein the metal shield comprises a first metal shield and a second metal shield, the first metal shield having a first metal plate with a first perimeter portion and a first plurality of tangs extending away from the first perimeter portion, the second metal shield having a second metal plate with a second perimeter portion and a second plurality of tangs extending away from the second perimeter portion, wherein the inclined interior surface of the enclosure urges each of the first plurality of tangs and each of the second plurality of tangs inward when the metal shield is disposed in the enclosure.

9. The assembly of claim 8, wherein the at least one sidewall of the enclosure urges each of the second plurality of tangs inward into contact with each of the first plurality of tangs when the metal shield is disposed in the enclosure.

10. The assembly of claim 1, wherein the bridge portion of each of the first and second pluralities of tangs is longer than the respective finger portion of each of the first and second pluralities of tangs.

11. The assembly of claim 1, wherein the first metal plate and the first plurality of tangs are formed from a first piece of metal, and wherein the second metal plate and the second plurality of tangs are formed from a second piece of metal.

12. The assembly of claim 1, wherein the first plurality of tangs are spaced equal to or less than ½" apart about and extend transversely away from the first perimeter portion of the first metal plate, and wherein the second plurality of tangs are spaced equal to or less than ½" apart about and extend transversely away from the second perimeter portion of the second metal plate.

13. The assembly of claim 1, wherein the inclined interior surface urges the finger portion of each of the second plurality of tangs inward into contact with the finger portion of each of the first plurality of tangs when the metal shield is disposed in the enclosure.

\* \* \* \* \*